(12) United States Patent
Shih et al.

(10) Patent No.: US 11,796,909 B2
(45) Date of Patent: *Oct. 24, 2023

(54) STRUCTURE AND METHOD OF RETICLE POD HAVING INSPECTION WINDOW

(71) Applicant: TAIWAN SEMICONDUCTOR MANUFACTURING COMPANY LTD., Hsinchu (TW)

(72) Inventors: Wang Cheng Shih, Hsinchu (TW); Hao-Ming Chang, Pingtung (TW); Chung-Yang Huang, Chiayi County (TW); Cheng-Ming Lin, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,734

(22) Filed: Apr. 25, 2022

(65) Prior Publication Data

US 2022/0260903 A1 Aug. 18, 2022

Related U.S. Application Data

(63) Continuation of application No. 16/732,204, filed on Dec. 31, 2019, now Pat. No. 11,314,164.

(51) Int. Cl.
*G03F 1/84* (2012.01)
*G03F 1/66* (2012.01)
*G03F 1/72* (2012.01)

(52) U.S. Cl.
CPC ................. *G03F 1/84* (2013.01); *G03F 1/66* (2013.01); *G03F 1/72* (2013.01)

(58) Field of Classification Search
CPC ................. G03F 1/66; G03F 1/72; G03F 1/84
USPC .............................................................. 430/5
See application file for complete search history.

(56) References Cited

U.S. PATENT DOCUMENTS 7,206,652 B2 * 4/2007 Burda ................. G03F 7/70741
700/121
11,314,164 B2 * 4/2022 Shih ................. H01L 21/67359

* cited by examiner

*Primary Examiner* — Christopher G Young
(74) *Attorney, Agent, or Firm* — WPAT LAW; Anthony King (57) ABSTRACT

A method of manufacturing a reticle includes: disposing the reticle in a reticle pod, the reticle pod forming a sealed space to accommodate the reticle, and the reticle pod comprising a window arranged on an upper surface of the reticle pod and configured to allow a radiation at a predetermined wavelength to pass through; and performing an inspection operation on the reticle through the window.

20 Claims, 10 Drawing Sheets

STRUCTURE AND METHOD OF RETICLE POD HAVING INSPECTION WINDOW

PRIORITY CLAIM AND CROSS-REFERENCE

This application is a continuation application of U.S. non-provisional application Ser. No. 16/732,204 filed Dec. 31, 2019, the disclosure of which is hereby incorporated by reference in its entirety.

BACKGROUND

Reticles are fabricated to form circuit patterns thereon and used to transfer the circuit patterns to wafers in a semiconductor manufacturing process. The fidelity and integrity of the reticle patterns are crucial to the success of mass production of the wafers and thus many techniques are proposed to fabricate the reticle and protect the reticle patterns from damage or contamination. A reticle pod is usually employed to house, protect and transport the reticles in modern semiconductor manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss structures and operating methods of a reticle pod. Embodiments of the present disclosure also discuss methods of manufacturing and repairing a reticle. The reticle pod generally includes a base and a cover that form a sealed space for accommodating the reticle. The proposed reticle pod features a window in the cover, wherein the window allows early detection of pattern defects during a manufacturing process of the reticle. Inspection operations may be performed immediately after a certain manufacturing step is performed in order to inspect whether a defect occurs due to this manufacturing step. The defect detection can therefore be performed in timely and more precise manners, and an early repair can be achieved accordingly.

Throughout the present disclosure, the terms "reticle," "photomask reticle" and "mask" may be used interchangeably to refer to a device used in a photolithography operation, in which an opaque image according to a circuit pattern is formed on a substrate plate. The substrate plate may be transparent. The image of the circuit pattern on the reticle is transferred to a substrate or a wafer through a radiation source of the photolithography operation. Radiation from the radiation source may impinge on the substrate via the reticle in a transmissive or reflective manner.

Figure 1:
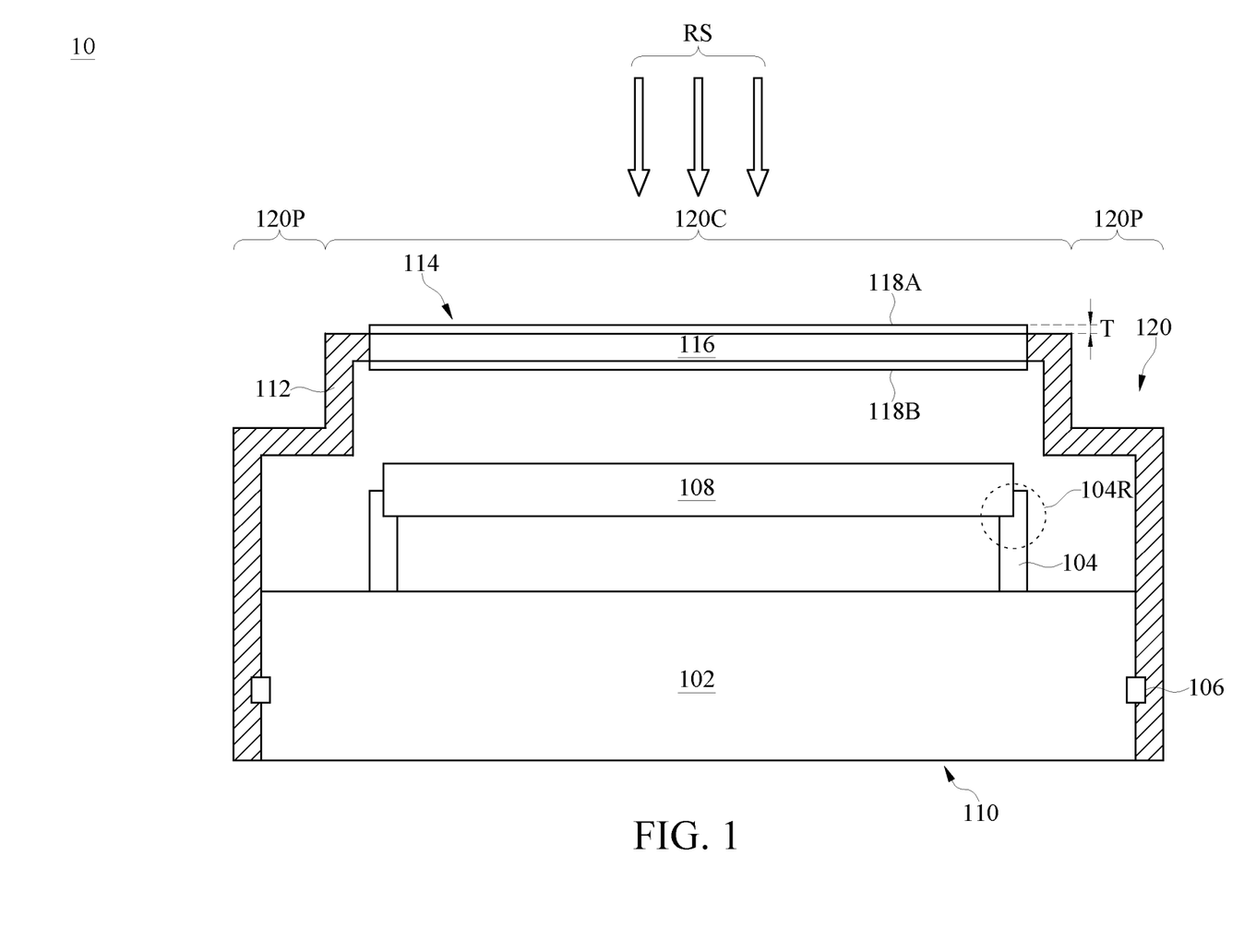
FIG. 1 is a schematic cross-sectional view of a reticle pod, in accordance with some embodiments.

FIG. 1 is a schematic cross-sectional view of a reticle pod 10, in accordance with some embodiments. The reticle pod 10 is used to accommodate a reticle 108. In some embodiments, the reticle 108 is a transmissive-type reticle, a reflective-type reticle, or another suitable type of reticle. The reticle pod 10 includes a base 110 and a cover 120 over the base 110. The cover 120 is detachably coupled to the base 110 for forming a closed space in which the reticle 108 is secured.

Figure 2A:
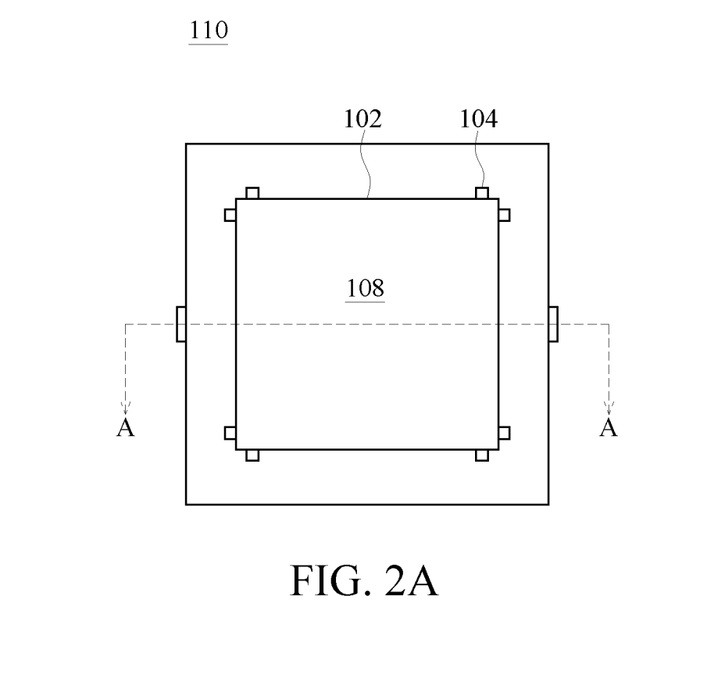
FIGS. 2A and 2B are schematic plan views of the reticle pod in FIG. 1, in accordance with some embodiments.
Figure 2B:
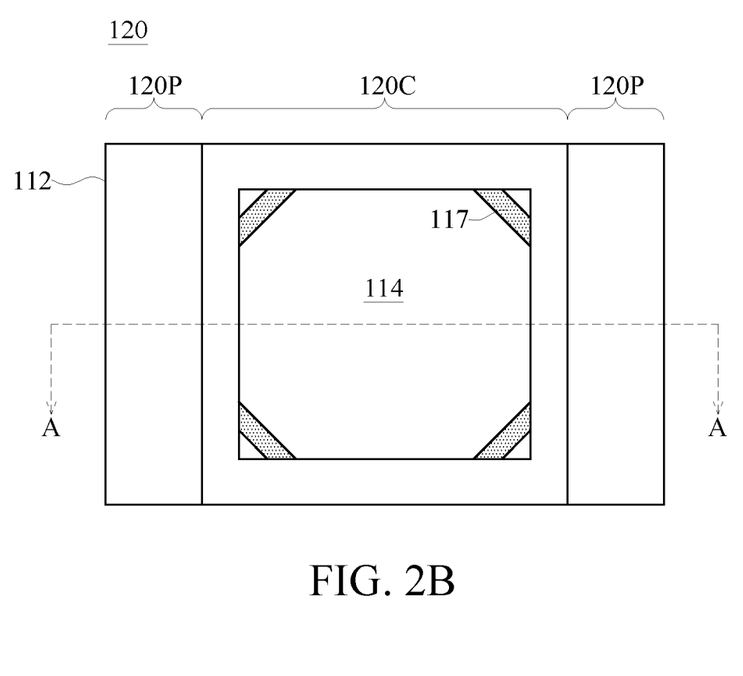

FIGS. 2A and 2B are schematic plan views of the base 110 and the cover 120, respectively, of the reticle pod 10 in FIG. 1, in accordance with some embodiments. The cross-sectional view of FIG. 1 is taken along the sectional lines AA in FIGS. 2A and 2B. Referring to FIG. 1 and FIG. 2A, the base 110 includes a platform 102, reticle holders 104 and latches 106. In some embodiments, the platform 102 is used to support the reticle 108 through the reticle holder 104. The platform 102 may be formed of PEEK (polyether ether ketone), PMMA (polymethyl methacrylate), or other suitable materials. The platform 102 may include a circular or quadrilateral shape, such as a rectangular or square shape. In some embodiments, the reticle 108 has a diameter or width W1 between about 14 cm and about 16 cm, such as 15 cm. In some embodiments, the platform 102 has a width W2 between about 22 cm and about 30 cm. In some embodiments, the width W2 of the platform 102 is between about 150% and about 200% of the width W1 of the reticle 108.

In some embodiments, the reticle holders 104 are used to support the reticle 108 such that the reticle is suspended above the platform 102 by a distance. In some embodiments, the reticle holders 104 are formed of PEEK, PMMA or other suitable materials. Referring to FIG. 2A, the reticle holders 104 may be disposed around the corners of the reticle 108 from a top-view perspective. For example, two reticle holders 104 are disposed closely adjacent to a corner of the reticle 108. Referring to FIG. 1, each of the reticle holders 104 may include a recess 104R that is adjacent to an upper surface from a cross-sectional view and may be configured to receive the reticle 108. In some other embodiments, the recess 104R of the reticle holders 104 is replaced with a chamfer that faces the reticle 108 and is configured to receive the reticle 108.

The latches 106 are used to couple the base 110 to the cover 120. In some embodiments, the cover 120 includes slots (not shown) corresponding to the latches 106 for coupling to the base 110. The latches 106 may be implemented by mechanical or electronic latching members, as known in the art. Through the latches 106, a closed space is formed by the base 110 and the cover 120 to retain and secure the reticle 108.

Referring to FIG. 1 and FIG. 2B, the cover 120 detachably houses the base 110 and is configured to cover the reticle 108 from above. The cover 120 includes a frame 112 and a window 114. The frame 112 constitutes the body of the cover 120 and provides physical support and mechanical strength to the cover 120.

The frame 112 may have various configurations depending on the requirements. For example, the frame 112 has a stepped shape from a cross-sectional view in which a central part 112C is higher than a peripheral part 112P surrounding the central part. In some embodiments, the cover 120 or the frame 112 has a height between about 5 cm and about 8 cm. The frame 112 may be formed of electrically insulating materials, e.g., a plastic or polymer material. In some embodiments, the frame 112 includes PEEK or PMMA. In some embodiments, the frame 112 is formed of opaque materials.

The window 114 is arranged in the central part 120C of the cover 120 that is higher than the peripheral part 120P of the cover 120. The frame 112 may include an opening in the central part 120C for accommodating the window 114 therein. The window 114 may be laterally surrounded by the frame 112. In some embodiments, the frame 112 includes support beams 117 around the corners of the window 114. The support beam 117 may form a right triangle with the sides of the window 114 to which the support beam 117 connects, wherein the support beam 117 serves as the hypotenuse of the triangle and supports the window 114 from the bottom of the window 114.

The reticle 108 includes circuit patterns on an upper side facing the window 114. The base 110 and the frame 112 are generally formed of opaque materials. Therefore, the window 114 allows manual or machine inspection of the reticle 108 when the reticle pod 10 is in a closed state. The window 114 may be formed of a window body 116 and films 118 coated on the window body 116. In some embodiments, the window 114 includes transparent materials. During an inspection operation, a radiation from a radiation source RS, e.g., a laser beam, may be emitted to impinge on the reticle 108. A patterned radiation reflected from the reticle 108 carries geometries of the circuit pattern on the reticle 108. A comparison of the reflected laser beam pattern with an original pattern can aid in detecting the defects in the circuit pattern, such as foreign contaminant, particles, protrusion, material loss (intrusion), excess material (extension or bridging), necking and pinholes. In some embodiments, the window 114 allows the radiation from the radiation source RS to pass through such that the radiation does not react with a photoresist material of the reticle 108. In some embodiments, the window 114 allows the radiation having a wavelength in the range of green light to pass through, wherein the wavelength of the radiation is between about 400 nanometers (nm) and about 700 nm. In some embodiments, the radiation has a wavelength between about 500 nm and about 560 nm. If a radiation at a wavelength greater than about 700 nm is used as an inspection radiation, the energy of the reflected light beam may be insufficient for accurately conveying the circuit pattern of the reticle 108. If a radiation at a wavelength less than about 400 nm is used as an inspection radiation, the energy of the inspection radiation may cause damage or unexpected reaction of the materials in the reticle 108, e.g., the photoresist material in the reticle 108 may react to the radiation in a manner that leads to property change.

In some embodiments, the window 114 has a quadrilateral shape, such as a rectangular or square shape. The window 114 is aligned with the reticle 108 when the reticle 108 is disposed in the reticle pod 10. In some embodiments, the window 114 covers the entire reticle 108 when the reticle 108 is disposed in the reticle pod 10 such that the radiation can be projected onto the entire upper surface of the reticle 108 and reflect back to a detection circuit through the window 114. In some embodiments, the window 114 covers an entirety of a pattern area within which the circuit pattern of the reticle 108 is formed. The window 114 may have a width W3 which is greater than or substantially equal to the width W1 of the reticle 108. In some embodiments, the width W3 is between about 15 cm and about 30 cm, or between about 18.75 cm and about 26.25 cm. In some embodiments, the width W3 is between about 125% and about 175% of the width W1 of the reticle 108. In some embodiments, the window 114 has an area between about 120% and about 250% of the area of the reticle 108.

In some embodiments, the window body 116 has a thickness between about 0.05 cm and about 1 cm. In some embodiments, the window body 116 may be formed of a transparent material, such as glass. The window body 116 may include fused silica ($SiO_2$), fused quartz, calcium fluoride ($CaF_2$), silicon oxide-titanium oxide alloy, sapphire or other suitable materials free of defects. In some embodiments, the window body 116 has a transmittance of greater than about 70%, greater than about 80%, or greater than about 90%, with respect to an inspection radiation.

In some embodiments, the films 118 are coated on both the outer surface (film 118A) and the inner surface (film 118B) of the window body 116, where the film 118A faces upward and the film 118B faces downward (i.e., facing the base 110). The films 118 may be coated on the window body 116 using physical vapor deposition (PVD), chemical vapor deposition (CVD), atomic layer deposition (ALD) or another suitable deposition process. The films 118 may improve the inspection efficiency and protection of the reticle 108. In some embodiments, the film 118 has a transmittance of greater than about 65%, greater than about 70%, or greater than about 80%, with respect to an inspection radiation. Furthermore, the films 118 may facilitate removal of electrostatic charges generated during transport of or contact with the reticle pod 10, and therefore damage due to electrostatic discharge of the reticle 108 or accumulation of contaminating particles resulting from the electrostatic charges can be reduced or eliminated. In some embodiments, the films 118 are conductive films and include a conductive material, such as aluminum zinc oxide (AZO), indium tungsten oxide (ITO), fluorine doped tin oxide (FTO), carbon nanotube or a combination thereof, for conducting electrostatic charges.

In some embodiments, the film 118A or 118B has a deposition thickness T, measured through the surface of one side of the window body 116, between about 20 nm and about 200 nm. The film 118A or 118B having a thickness less than about 20 nm may not provide sufficient capability of conducting electrostatic charges. The film 118A or 118B having a thickness greater than about 200 nm may not provide sufficient transmittance for the inspection radiation of interest. In some embodiments, the thickness of the film 118A or 118B is reduced if the inspection radiation has a greater wavelength. In some embodiments, the film 118 formed of AZO includes a thickness of about 20 nm with respect to an inspection radiation at a wavelength between 400 nm and about 700 nm. In some embodiments, the film 118 formed of ITO includes a thickness between about 20 nm and about 100 nm with respect to an inspection radiation at a wavelength between about 400 nm and about 500 nm. In some embodiments, the film 118 formed of ITO includes a thickness of between about 90 nm and about 110 nm, such as 100 nm, with respect to an inspection radiation at a wavelength between about 500 nm and about 600 nm. In some embodiments, the film 118 formed of ITO includes a thickness between about 100 nm and about 200 nm with respect to an inspection radiation at a wavelength between about 600 nm and about 700 nm.

In some embodiments, the inspection operation is performed under an atmosphere pressure. Although the chances of contamination at the atmosphere pressure may be higher than that at a vacuum environment, the reticle 108 can still be well protected by the reticle pod 10 during the inspection operation since the reticle 108 is inspected within the sealed reticle pod 10. The inspection radiation can be emitted to the pattern of the reticle 108 through the window 114 without exposing the reticle 108 to the outside of the reticle pod 10, the likelihood of contamination can be reduced.

FIGS. 3A to 3L are schematic cross-sectional views of intermediate stages of a method of manufacturing the reticle 108, in accordance with some embodiments. The reticle 108 may be categorized as a transmissive type, a reflective type, or another suitable type. In the depicted example, a transmissive-type reticle 108 is illustrated. It is understood that additional operations can be provided before, during, and after processes shown in FIGS. 3A to 3L, and some of the operations described below can be replaced or eliminated for additional embodiments of the method. The order of the operations may be interchangeable. Further, the same or similar configuration, structure, materials, operations or processes of the foregoing embodiments may be employed in this embodiment and the detailed explanation may be omitted.

Figure 3A:
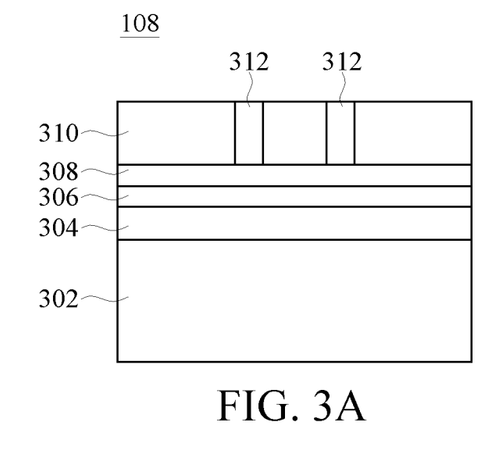
FIGS. 3A to 3L are schematic cross-sectional views of intermediate stages of a method of manufacturing a reticle, in accordance with some embodiments.

Referring to FIG. 3A, the reticle 108 is received or provided and includes a stack of a substrate 302, a phase shift layer 304, a shielding layer 306, a mask layer 308 and a photoresist layer 310 over one another. It is understood that other layers may be optionally added to the stack of the reticle 108.

In some embodiments, the substrate 302 is configured to allow photolithography radiation to pass through. The substrate 302 may be a low temperature expansion material (LTEM). In some embodiments, the substrate 302 is a transparent material and may be formed of fused silica, fused quartz, calcium fluoride ($CaF_2$), silicon carbide, silicon oxide-titanium oxide alloy and/or other suitable LTEM.

In some embodiments, the phase shift layer 304 is configured to change or shift the phase of the incident radiation that passes through in order to improve the image sharpness. In some embodiments, the phase shift layer 304 includes molybdenum-silicon nitride (MoSiN), molybdenum-silicide (MoSi), molybdenum-silicon oxynitride (MoSiON), titanium nitride, titanium silicon nitride, silicon nitride, or other suitable materials.

In some embodiments, the shielding layer 306 is configured to absorb undesired portions of incident photolithography radiation for forming a patterned lithography radiation on a workpiece. In some embodiments, the shielding layer 306 includes chromium or a compound thereof, such as CrN, CrON, and CrO. In some embodiments, the shielding layer 306 includes molybdenum or a compound thereof, such as MoSi, MoSiN, and MoSiON. In some embodiments, the shielding layer 306 includes tantalum or a compound thereof, such as TaN, TaON, TaB, TaBN, TaHfN, TaHf, TaSi, TaSiN, TaGe, TaGeN, TaZrN, and TaZr.

In some embodiments, the mask layer 308 includes silicon oxide, silicon nitride, silicon oxynitride, silicon carbide, or other masking materials. In some embodiments, the photoresist layer 310 includes a photosensitive material that serves as a positive-tone photoresist or a negative-tone photoresist.

Each of the phase shift layer 304, the shielding layer 306, the mask layer 308 and the photoresist layer 310 may be deposited over the substrate 302 by PVD, CVD, ALD, spin coating, or another suitable deposition technique.

Still referring to FIG. 3A, an exposure operation is performed on the photoresist layer 310 to transfer a predetermined circuit pattern to the photoresist layer 310. Portions 312 of the photoresist layer 310 corresponding to the circuit pattern are exposed accordingly. The portions 312 may be exposed using an electron-beam (e-beam) writer. The e-beam writer generates a geometrically constrained stream of electrons that irradiate selected areas of the photoresist layer 310. One of ordinary skill in the art will recognize that any other suitable writer may be used for irradiating selected areas of the photoresist layer 310. In the case of a positive-tone photoresist layer 310, the irradiated areas are made soluble in the developer and the non-irradiated areas remain insoluble in the developer.

In some embodiments, a post-exposure bake operation is performed to enhance the exposure performance and causes the exposed portions 312 to extend through the thickness of the photoresist layer 310.

Figure 3B:
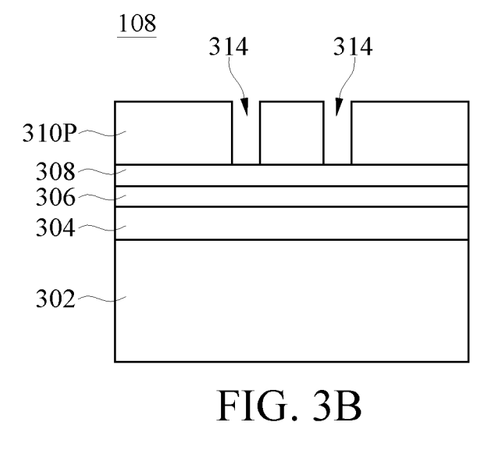

Referring to FIG. 3B, a development operation is performed to remove the exposed portions 312 using a developer. Trenches 314 are formed in the photoresist layer 310 and expose an upper surface of the mask layer 308. The developer may be a positive-tone developer or a negative-tone developer. Therefore, a patterned photoresist layer 310P is formed.

Figure 3C:
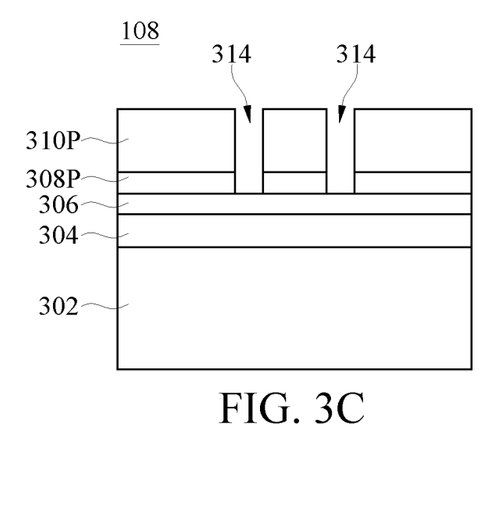

Subsequently, the mask layer 308 is etched as shown in FIG. 3C. The mask layer 308 is etched using a dry etch, a wet etch or a combination thereof, using the patterned photoresist layer 310P as an etch mask and stopping at the shielding layer 306. As a result, a patterned mask layer 308P is formed such that the circuit pattern is transferred thereto from the patterned photoresist layer 310P.

Figure 3D:
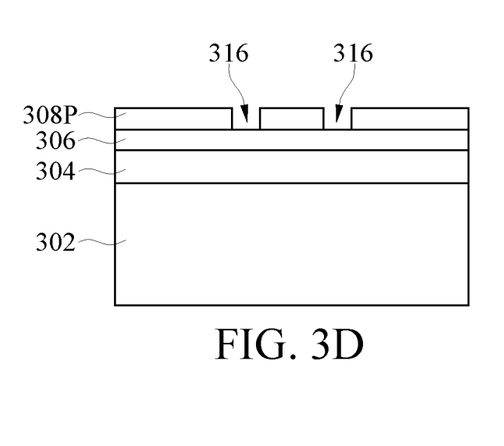

FIG. 3D illustrates the stripping of the patterned photoresist layer 310P once the patterned mask layer 308P is formed. The patterned photoresist layer 310P may be stripped using a dry etch, a wet etch, a laser etch, a combination thereof, or another suitable stripping operation.

Figure 3E:
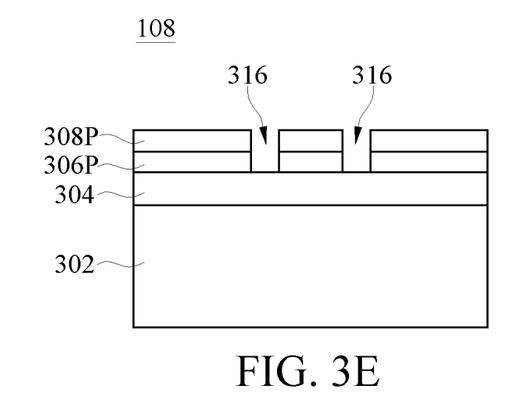

FIG. 3E shows the subsequent forming of a patterned shielding layer 306P. The forming of the patterned shielding layer 306P is performed by etching the shielding layer 306 using the mask layer 308 as an etch mask. As a result, the trenches 316 extend through the shielding layer 306 and stop at the phase shift layer 304. An upper surface of the phase shift layer 304 is therefore exposed. In some embodiments, the circuit pattern is transferred to the patterned shielding layer 306P. The etching of the patterned shielding layer 306P may be performed using a dry etch, a wet etch or a combination thereof.

Figure 3F:
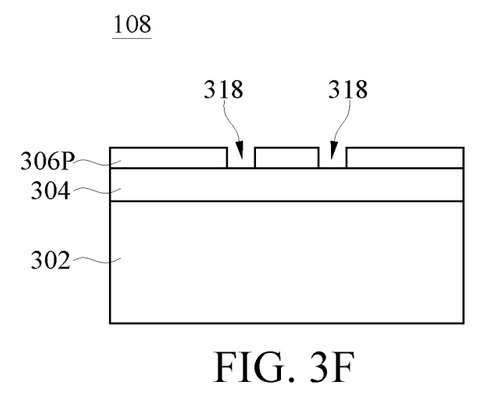

FIG. 3F illustrates the removal of the patterned mask layer 308P once the patterned shielding layer 306P is formed. The patterned mask layer 308P may be removed using a dry etch, a wet etch, a laser etch, or another suitable stripping operation. Trenches 318 in the patterned shielding layer 306P that correspond to the trenches 316 and represent the circuit pattern remain in place after the removal operation.

Figure 3G:
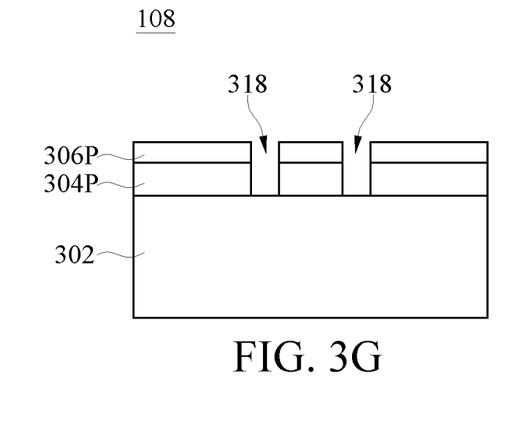

FIG. 3G shows the subsequent patterning of the phase shift layer 304 to form a patterned phase shift layer 304P. The patterning of the phase shift layer 304 is performing by etching the phase shift layer 304 using the patterned shielding layer 306P as an etch mask. As a result, the trenches 318 extend through the phase shift layer 304 and stop at the substrate 302. An upper surface of the substrate 302 is therefore exposed. In some embodiments, the circuit pattern is transferred to the patterned phase shift layer 304P. The patterned phase shift layer 304P is formed using a dry etch, a wet etch or a combination thereof.

Figure 3H:
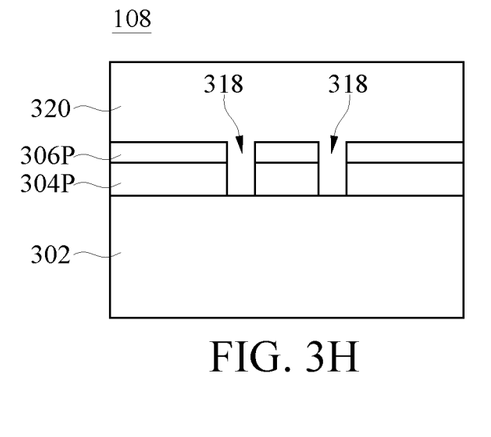

Referring to FIG. 3H, a second photoresist layer 320 is deposited over the patterned shielding layer 306P and the patterned phase shift layer 304P. The second photoresist layer 320 may cover the patterned shielding layer 306P and may fill the trenches 318. In some embodiments, the second photoresist layer 320 includes a photosensitive material and may use a material the same as or different from that of the photoresist layer 310.

Figure 3I:
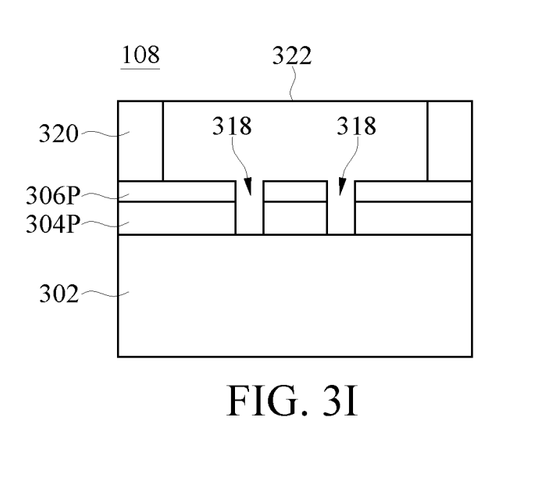

Still referring to FIG. 3I, an exposure operation is performed on the second photoresist layer 320 to transfer a second pattern to the second photoresist layer 320. Portions 322 in the second photoresist layer 320 corresponding to the second pattern are exposed accordingly. The portions 322 may be exposed using an electron-beam (e-beam) writer or any other suitable writer for irradiating selected areas of the second photoresist layer 320.

Figure 3J:
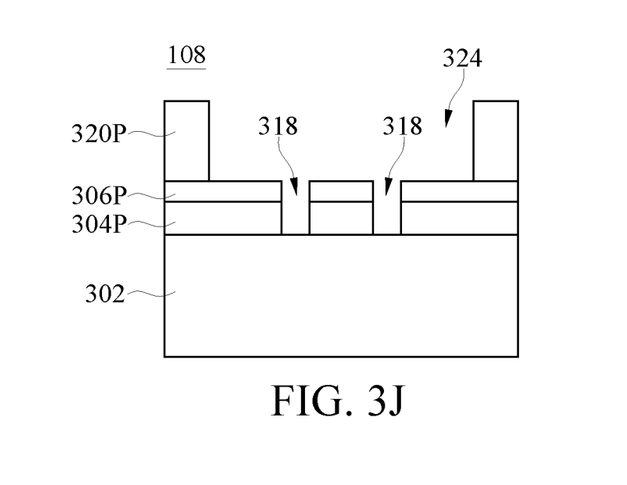

Referring to FIG. 3J, a development operation is performed to remove the exposed portions 322. A recess 324 is formed in the second photoresist layer 320, wherein the recess 324 re-opens the trenches 318 and may partially expose the upper surface of the patterned shielding layer 306P. Therefore, a patterned second photoresist layer 320P is formed. The development operation may be performed using a developer that serves as a positive-tone developer or a negative-tone developer.

Figure 3K:
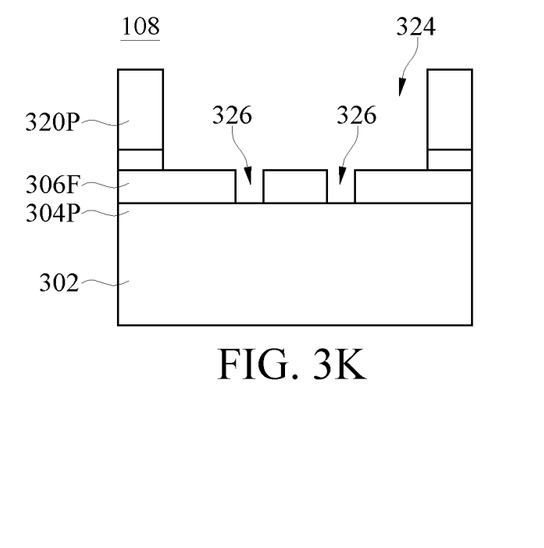

Subsequently, the patterned shielding layer 306P is etched to form the second pattern in an additionally-patterned shielding layer 306F, as shown in FIG. 3K. The patterned shielding layer 306P is etched using a dry etch, a wet etch or a combination thereof, using the patterned second photoresist layer 320P as an etch mask. Therefore, the additionally-patterned shielding layer 306F is formed. Trenches 326 corresponding to the trenches 318 are formed in the patterned phase shift layer 304P. The patterned phase shift layer 304P is kept substantially intact during the patterning operation of the additionally-patterned shielding layer 306F.

Figure 3L:
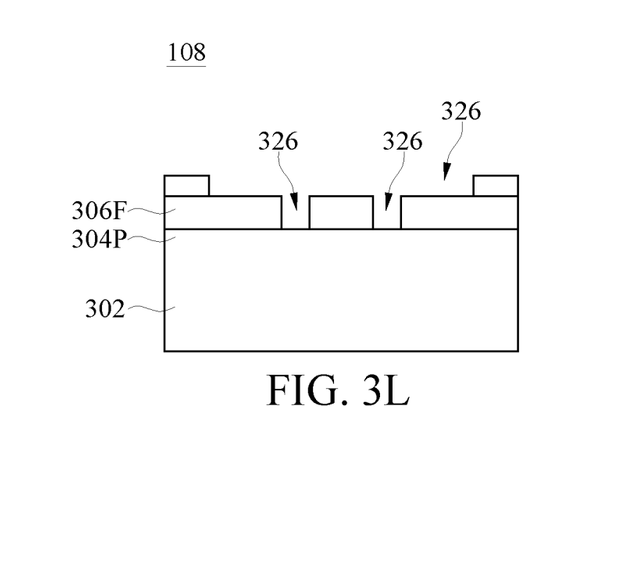

FIG. 3L illustrates the stripping of the patterned second photoresist layer 320P after the additionally-patterned shielding layer 306F is formed. The patterned second photoresist layer 320P may be stripped using a dry etch, a wet etch, a laser etch, or another suitable stripping operation. In some embodiments, the second pattern in the patterned phase shift layer 304P increases the sharpness of the image of the additionally-patterned shielding layer 306F that is to be projected onto the reticle 108.

As discussed previously, the reticle pod 10 that includes the cover 120 having the window 114 enables early detection for reticle manufacturers in any intermediate stage of the manufacturing procedure, in which the reticle pod 10 is moved out of the manufacturing tool and subjected to the inspection operation with the reticle 108 being kept sealed within the reticle pod 10. Since there is no need to remove the reticle 108 out of the reticle pod 10 and to expose the reticle 108 to an atmosphere pressure environment of the inspection operation, the likelihood of contamination is reduced. Further, the reticle defects can be detected and repaired in an earlier stage.

Figure 4A:
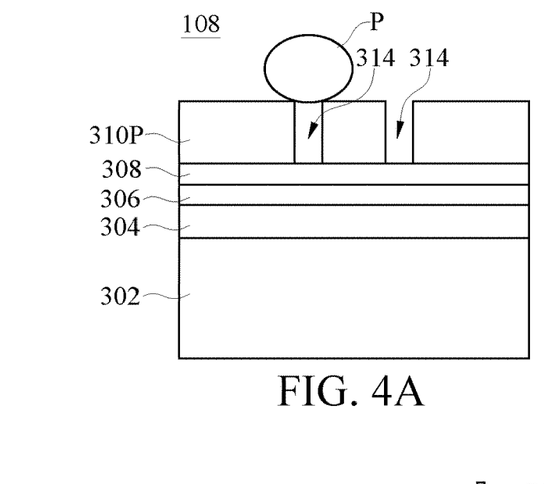
FIGS. 4A to 4E are schematic cross-sectional views of intermediate stages of a method of repairing a reticle, in accordance with some embodiments.

FIGS. 4A to 4E are schematic cross-sectional views of intermediate stages of a method of repairing the reticle 108, in accordance with some embodiments. FIG. 4A shows a schematic cross-sectional view of the reticle 108 immediately after the development operation for forming the patterned photoresist layer 310P with reference to FIG. 3B. A foreign particle P over a left-side trench 314 is detected during the inspection operation. The inspection may be executed across the upper surface of the reticle 108 and FIG. 4A is shown for illustrational purposes. This detected particle P may imply that a processing tool having processing chambers for performing the development operation or preceding operations is contaminated. A cleaning operation may be required before the processing tool is operated on the next reticle. The cleaning operation may include a purge step using a purge gas pulse comprising an inert gas, such as nitrogen ($N_2$), helium (He), neon (Ne), argon (Ar), krypton (Kr), xenon (Xe), or radon (Rn). In some embodiments, the cleaning operation includes evacuation of the processing chamber to remove unreacted oxygen-containing gas, unreacted metal-containing gas, and any byproducts from the processing chamber. The early detection of the contamination location aids in accurately identifying the contaminated processing tool in the processing system and therefore saves time and cost.

Figure 4B:
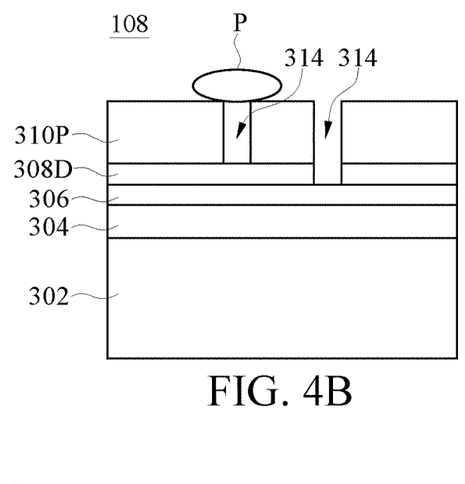
Figure 4C:
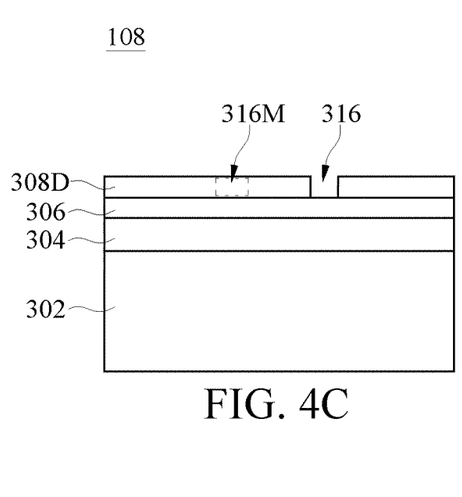

FIG. 4B illustrates a schematic cross-sectional view of the reticle 108 immediately after the patterning operation of the mask layer 308 with reference to FIG. 3C. The particle P may not be detected or cleared at the time before the patterning of the mask layer 308. As a result, the etchant of the patterning operation is obstructed by the particle P and fails to reach the left-side trench 314. A defective patterned mask layer 308D is formed accordingly. FIG. 4C illustrates a schematic cross-sectional view of the reticle 108 immediately after the stripping operation of the patterned photoresist layer 310P with reference to FIG. 3D. The left-side trench 316 that would otherwise be created in a contamination-free patterning operation is missing due to the particle P and instead there is an excess portion 316M of the defective patterned mask layer 308D.

Figure 4D:
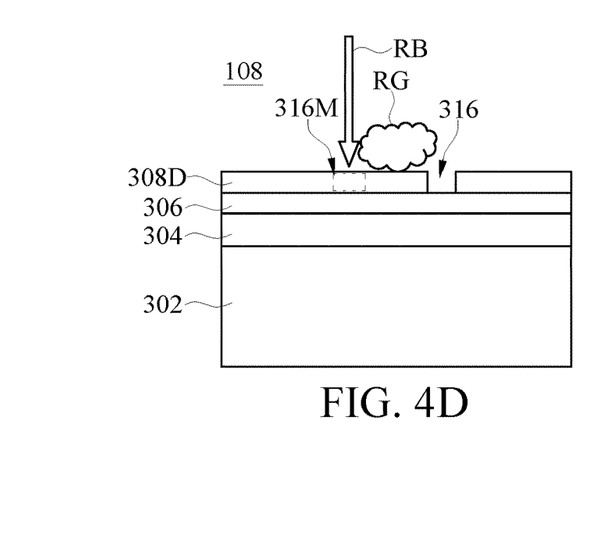

FIG. 4D illustrates a schematic repairing operation in accordance with some embodiments. A repairing radiation beam RB, which may be a laser beam or an electron beam (e-beam), is used to remove or etch the excess portion 316M of the defective patterned mask layer 308D. The radiation beam RB may be properly controlled in power and radiation profile to fit the geometries of the portion 316M without adversely affecting the remaining portions of the defective patterned mask layer 308D. In some embodiments, an etching gas RG is introduced during the repairing operation. The etching gas aids in the removal of the excess portion 316M together with the application of the radiation beam RB. In some embodiments, the etching gas RG with respect to the defective patterned mask layer 308D may include a fluorine-based gas, such as $F_2$, $CF_4$, $SF_6$, $SnF_4$, $XeF_2$, or another suitable gas such as $I_2$.

Figure 4E:
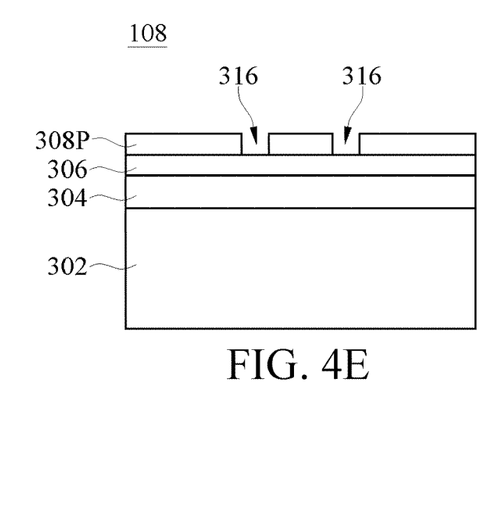

FIG. 4E shows a schematic cross-sectional view of a repaired reticle 108, in accordance with some embodiments. As shown in FIG. 4E, the circuit pattern of the patterned mask layer 308P is correctly restored to match that of the successfully fabricated reticle 108 shown in FIG. 3D.

Figure 5A:
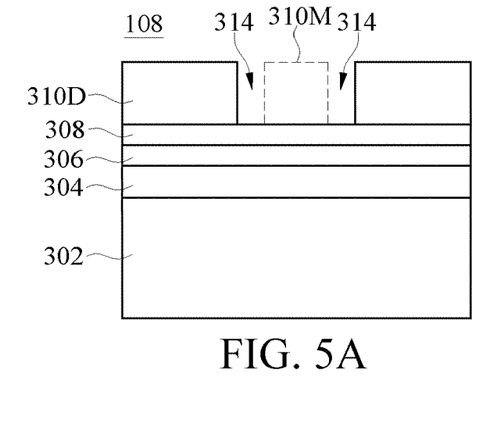
FIGS. 5A to 5E are schematic cross-sectional views of intermediate stages of a method of repairing a reticle, in accordance with some embodiments.

FIGS. 5A to 5E are schematic cross-sectional views of intermediate stages of a method of repairing the reticle 108, in accordance with some embodiments. FIG. 5A shows a schematic cross-sectional view of the reticle 108 immediately after the development operation for forming the patterned photoresist layer 310P with reference to FIG. 3B. A defective patterned photoresist layer 310D is detected, wherein a portion 310M (referred to as an intrusion) is erroneously removed during the development operation. This may imply that the design, such as the recipe parameters of the operation for forming the patterned photoresist layer 310P, contain errors, or the materials of the photoresist layer 310 are degraded. In some embodiments, a material rebuilding operation may be performed for repairing the portion 310M. The early detection of the location of the defective portion aids in accurately identifying the problematic design during the processing procedure. The material rebuilding operation may be introduced in the current or subsequent steps by taking into account the processing time and cost of each option. In some embodiments, the defective patterned photoresist layer 310D is stripped in a repairing operation. Subsequently, a series of deposition, exposure, and development operations are applied anew to form a defect-free patterned photoresist layer 310P over the mask layer 308, and the manufacturing procedure continues with the step with reference to FIG. 3C.

Figure 5B:
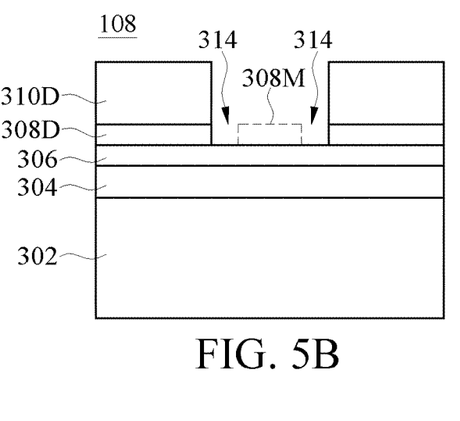
Figure 5C:
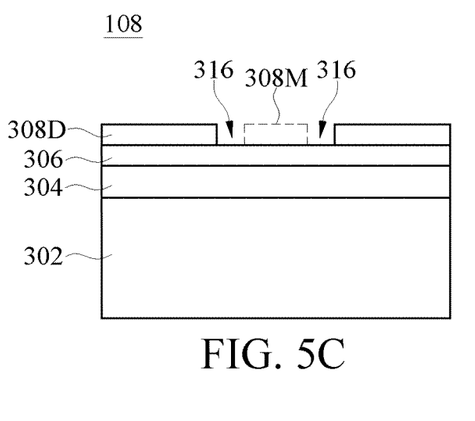

FIG. 5B illustrates a schematic cross-sectional view of the reticle 108 immediately after the patterning operation of the patterned mask layer 308P with reference to FIG. 3C. In some embodiments, the defective patterned photoresist layer 310D is not repaired before the patterning of the mask layer 308. As a result, the etchant for patterning the mask layer 308 etches a portion 308M, in addition to forming the trenches 314, due to the absence of the portion 310M. A defective patterned mask layer 308D is formed accordingly. FIG. 5C illustrates a schematic cross-sectional view of the reticle 108 immediately after the stripping operation of the patterned photoresist layer 310P with reference to FIG. 3D. The portion 308M that would be otherwise formed in place in a defect-free patterning operation is missing.

Figure 5D:
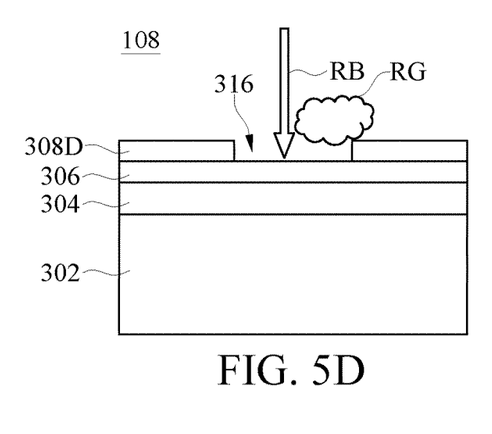

FIG. 5D illustrates a schematic repairing operation in accordance with some embodiments. A repairing radiation beam RB, which may be a laser beam or an electron beam (e-beam), is used to rebuild the portion 308M of the defective patterned mask layer 308D. The radiation beam RB may be properly controlled in power and radiation profile to fit the geometries of the portion 308M without adversely affecting the remaining portions of the defective patterned mask layer 308D or the underlying shielding layer 306. In some embodiments, a reacting gas RG is introduced during the repairing operation. The reacting gas RG aids in the formation of the portion 308M together with the application of the radiation beam RB. In some embodiments, the reacting gas RG with respect to the defective patterned mask layer 308D may include a silicon-based material, such as $(CH_3O)_4Si$, $(C_2H_5O)_4Si$, $(CH_4SiO)_4$, $(CH_4SiO)_5$, or another suitable material.

Figure 5E:
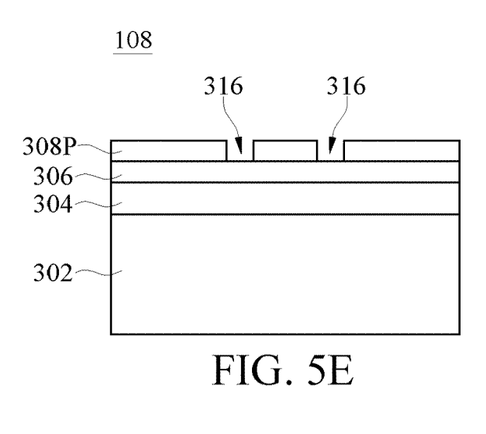

FIG. 5E shows a schematic cross-sectional view of a repaired reticle 108, in accordance with some embodiments. As shown in FIG. 5E, the circuit pattern of the patterned mask layer 308P is correctly restored to match that of the successfully fabricated reticle 108 in FIG. 3D.

Figure 6A:
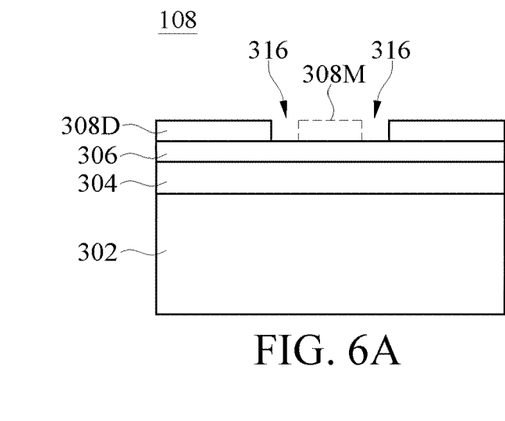
FIGS. 6A to 6E are schematic cross-sectional views of intermediate stages of a method of repairing a reticle, in accordance with some embodiments.

FIGS. 6A to 6E are schematic cross-sectional views of intermediate stages of a method of repairing the reticle 108, in accordance with some embodiments. The method illustrated in FIGS. 6A to 6E addresses a detection scenario similar to that illustrated in FIGS. 5A to 5E, but adopts a different approach. FIG. 6A shows a schematic cross-sectional view of the reticle 108 similar to that shown in FIG. 5C, in which a defective patterned mask layer 308D is detected. The portion 310M, which should otherwise exist, is erroneously removed during the development operation.

Figure 6B:
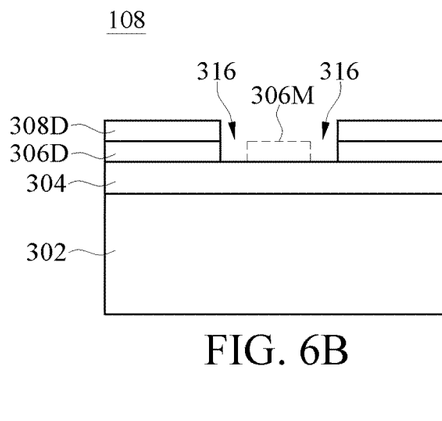
Figure 6C:
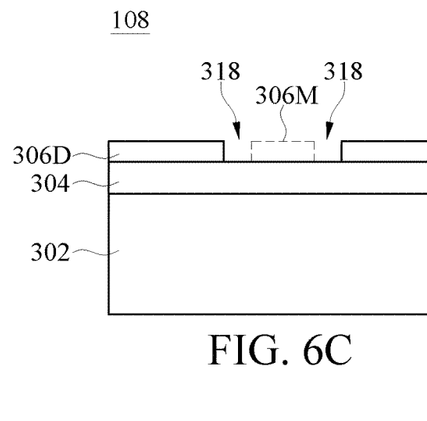

FIG. 6B illustrates a schematic cross-sectional view of the reticle 108 immediately after the patterning operation of the shielding layer 306 with reference to FIG. 3E. In some embodiments, the defective patterned photoresist layer 310D and the defective patterned mask layer 308D are not repaired before the patterning of the shielding layer 306. As a result, the etchant for patterning the shielding layer 306 erroneously etches a portion 306M, in addition to forming the trenches 318, due to the absence of the portions 310M and 308M as etch masks. A defective patterned shielding layer 306D is formed accordingly. FIG. 6C illustrates a schematic cross-sectional view of the reticle 108 immediately after the stripping operation of the patterned mask layer 308P with reference to FIG. 3F. The portion 306M that would be otherwise formed in place in a defect-free patterning operation is missing.

Figure 6D:
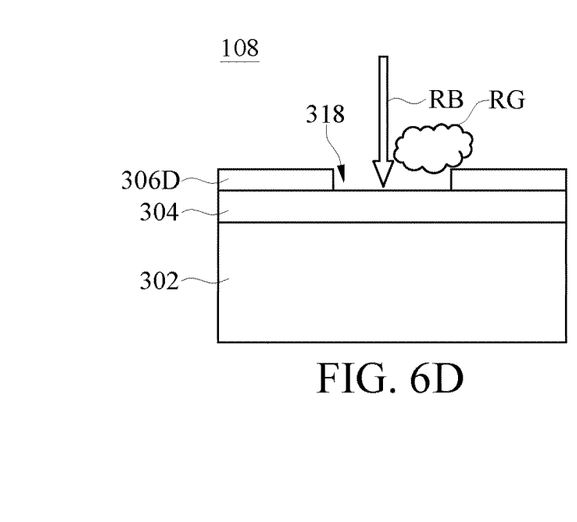

FIG. 6D illustrates a schematic repairing operation in accordance with some embodiments. A repairing radiation beam RB, which may be a laser beam or an electron beam (e-beam), is used to rebuild the portion 306M of the defective patterned shielding layer 306D. The radiation beam RB may be properly controlled in power and radiation profile to fit the geometries of the portion 306M without adversely affecting the remaining portions of the defective patterned shielding layer 306D or the underlying phase shift layer 304. In some embodiments, a reacting gas RG is introduced during the repairing operation. The reacting gas RG aids in the formation of the portion 306M together with the application of the radiation beam RB. In some embodiments, the reacting gas RG with respect to the patterned shielding layer 306P may include a chlorine-based gas, such as $Cl_2$, $SnCl_4$, NOCl, $NO_2Cl$, $CCl_4$, or another suitable gas.

Figure 6E:
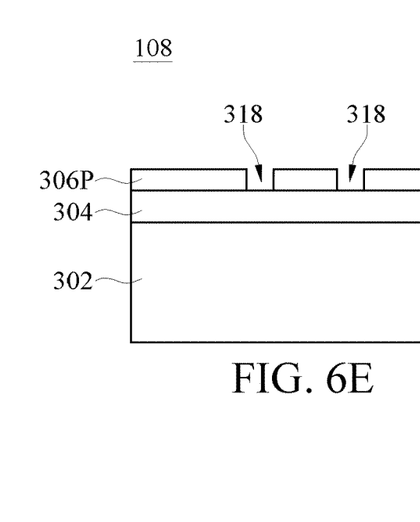

FIG. 6E shows a schematic cross-sectional view of a repaired reticle 108, in accordance with some embodiments. As shown in FIG. 6E, the circuit pattern of the patterned shielding layer 306P is correctly restored to match that of the successfully fabricated reticle 108 in FIG. 3F.

Figure 7:
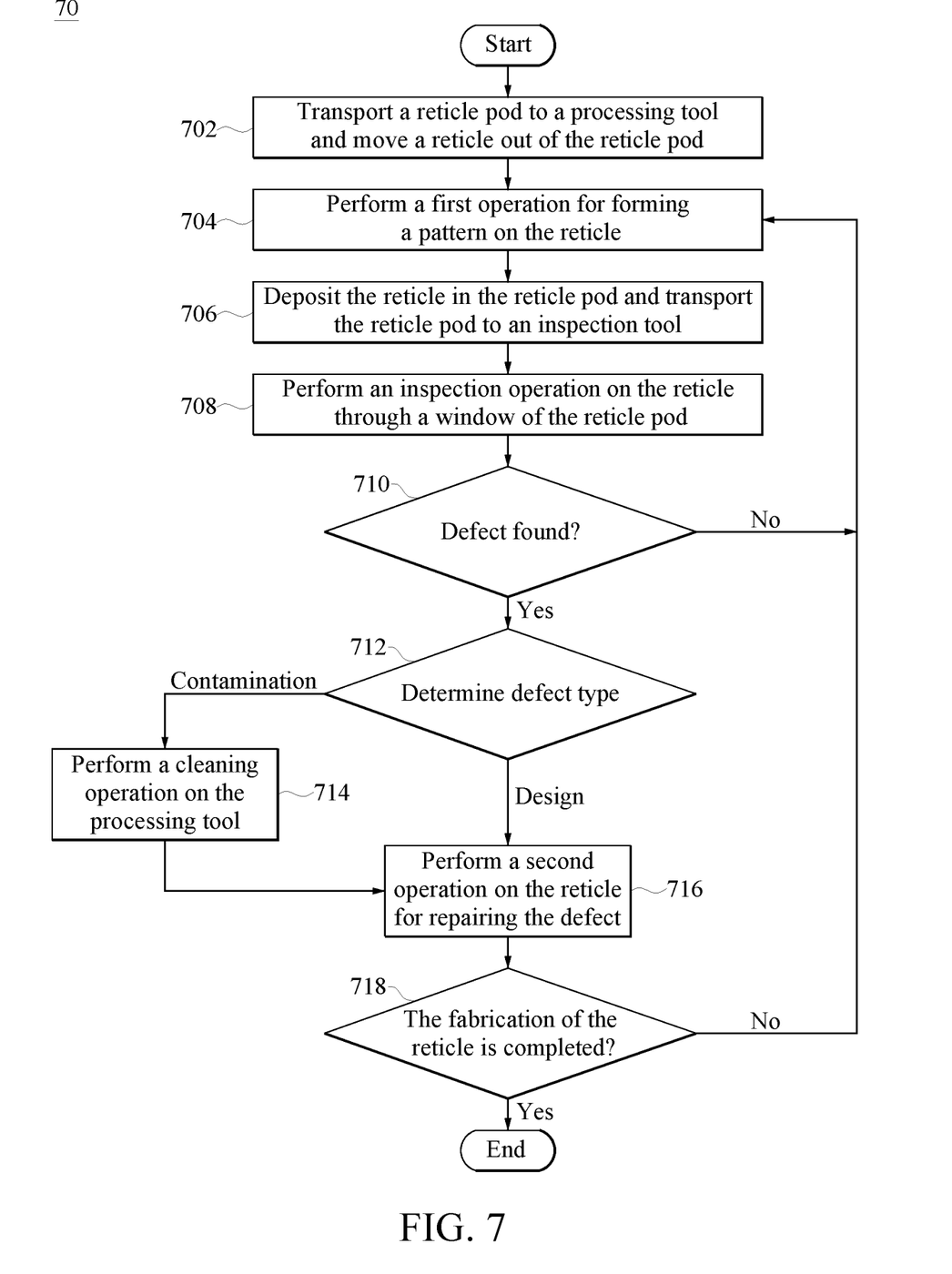
FIG. 7 is a flowchart of a method of manufacturing a reticle, in accordance with some embodiments.

FIG. 7 is a flowchart of a method 70 of manufacturing a reticle, in accordance with some embodiments. It is understood that additional operations can be provided before, during, and after the steps in FIG. 7, and some of the operations described below can be replaced or eliminated for additional embodiments of the method 70. The order of the operations may be interchangeable. Further, the same or similar configuration, structure, materials, operations or processes of the foregoing embodiments may be employed in this embodiment and the detailed explanation may be omitted.

At step 702, a reticle pod is transported to a processing tool and a reticle is moved out of the reticle pod. At step 704, a first operation is performed on the reticle for forming a pattern on the reticle. In some embodiments, the first operation may include one or more of the operations illustrated in FIGS. 3A to 3L, and may include exposure, development, baking, etching, stripping, or other semiconductor processing operations.

At step 706, the reticle is deposited in the reticle pod and the reticle pod is transported to an inspection tool. At step 708, an inspection operation is performed on the reticle through a window of the reticle pod. The material and configuration of the window are described with reference to the window 114 in FIG. 1 and FIG. 2B.

At step 710, it is determined during the inspection operation whether any defect is found. If affirmative, the method 70 proceeds with step 712 to determine the defect type. If it is determined at step 710 that no defect is found in the reticle, the method loops back to step 704 for performing a subsequent manufacturing step until the reticle is completed.

At step 712, it is determined whether the defect type is a contamination type or a design type. If it is determined that the detected defect is categorized as a contamination type, the method 70 proceeds with step 714 in which the processing tool is shut down and a cleaning operation is performed on the processing tool for cleaning up the foreign particles, dust or unreacted gas. The processing tool resumes operation again if no further contamination is found.

Subsequently, at step 716, a second operation is performed on the reticle for repairing the defect. During step 716, the reticle pod is transported to the processing chamber and the reticle is removed from the reticle pod, after which a second operation is performed for repairing the defect. The second operation may include removal of excess portions or rebuilding of missing portions of one or more layers in the reticle.

In some embodiments, the method 70 accesses a library of reticle patterns to determine the type of the defect. The library stores relate several reticle patterns to identified causes of the defects. As discussed previously, the defects may be caused due to contamination or design error. Further, the defective reticle patterns resulting from contamination or design error may have specific appearances. The library may help identify which type of design error, e.g., bridging, intrusion and protrusion, given the acquired pattern image of the reticle. The library may improve the efficiency and accuracy of the causes based on the inspection image of the reticle.

In some embodiments, the method 70 proceeds with step 708 for inspecting the reticle after the repairing operation at step 716. The method 70 may cycle through the steps 708, 710, 712, 714 and 716 until no defects are found in the repaired reticle.

If it is determined at step 712 that the detected defect is categorized as a design type, the method 70 proceeds with step 716 for performing the second operation. At step 718, it is determined whether the fabrication of the reticle is completed. If affirmative, the method 70 is concluded. If one or more operations are required, the method 70 loops back to step 704 for performing another first operation until the reticle is completed.

Figure 8:
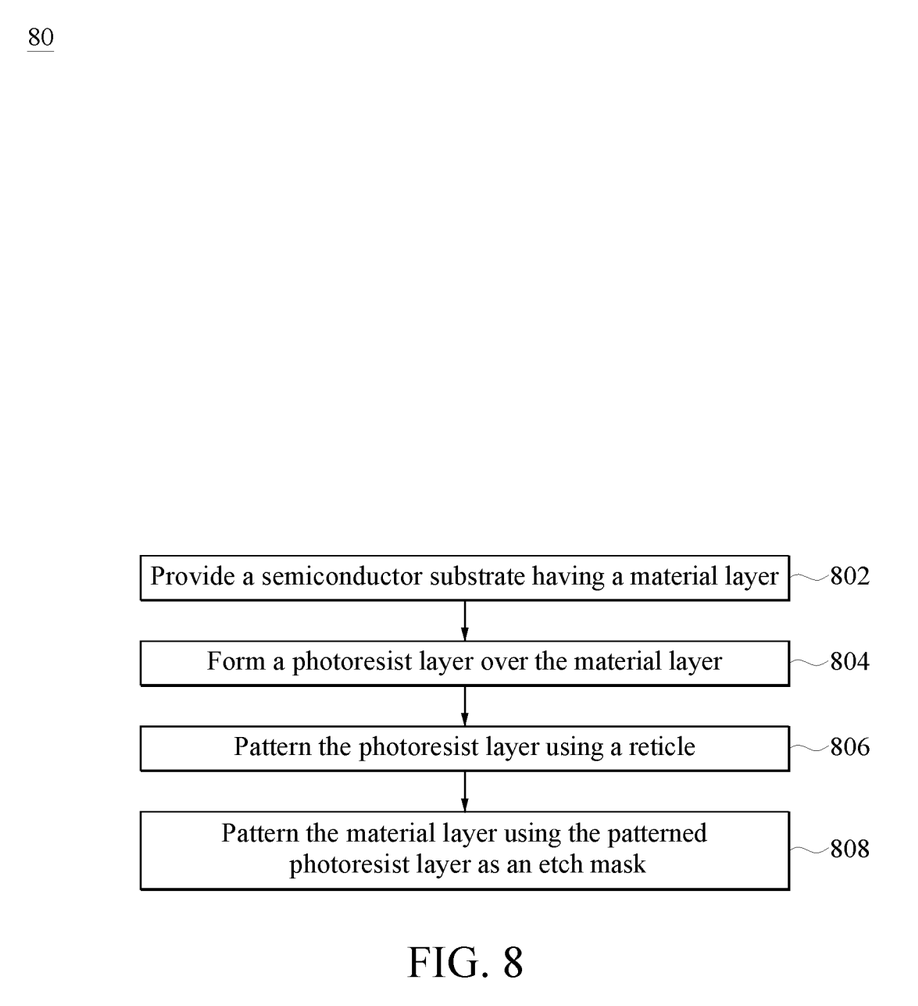
FIG. 8 is a flowchart of a method of manufacturing a semiconductor device, in accordance with some embodiments.

FIG. 8 is a flowchart of a method 80 of manufacturing a semiconductor device, in accordance with some embodiments. The semiconductor device may be manufactured using the reticle 108 that is fabricated, inspected, repaired and operated in related to the reticle pod 10 as described in preceding paragraphs. The reticle 108 used in method 80 is deemed as completed and no defects have been found therein. It is understood that additional operations can be provided before, during, and after the steps in FIG. 8, and some of the operations described below can be replaced or eliminated for additional embodiments of the method 80. The order of the operations may be interchangeable. Further, the same or similar configuration, structure, materials, operations or processes of the foregoing embodiments may be employed in this embodiment and the detailed explanation may be omitted.

The method 80 begins at step 802, wherein a workpiece, such as a semiconductor substrate having a material layer, is provided. The semiconductor substrate includes a semiconductor material such as silicon. In some embodiments, the semiconductor substrate may include other semiconductor materials, such as silicon germanium, silicon carbide, gallium arsenide, or the like. Alternatively, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the semiconductor substrate includes doped regions, such as p-type doped regions or n-type doped regions.

In some embodiments, the material layer of the semiconductor substrate may be a semiconductor layer, a dielectric layer or a conductive layer. In some embodiments, the material layer may be embedded in the semiconductor substrate or deposited over the semiconductor substrate. The material layer may be formed of a single layer or may include a multilayer structure.

At step 804, a photoresist layer is formed over the material layer. The photoresist layer may be formed over the material layer by CVD, PVD, ALD, spin coating, or another suitable film-forming method. Next, the method 80 continues with step 806, in which the photoresist layer is patterned using a reticle, such as the reticle 108 described above, in a lithography operation. In an embodiment, the reticle may be disposed on a reticle stage of a lithography system and the semiconductor substrate may be disposed on a wafer stage. The lithography operation may involve projection of an exposure radiation onto the photoresist layer via transmission or reflection onto the reticle. Portions of the photoresist layer may be removed after the lithography operation.

The method 80 continues with step 808 to pattern the material layer using the patterned photoresist layer as an etch mask. Next, the photoresist layer is removed. The removal operations may include an etching or ashing operation.

According to an embodiment, a method of manufacturing a reticle includes: disposing the reticle in a reticle pod, the reticle pod forming a sealed space to accommodate the reticle, and the reticle pod comprising a window arranged on an upper surface of the reticle pod and configured to allow a radiation at a predetermined wavelength to pass through; and performing an inspection operation on the reticle through the window.

According to an embodiment, a method of manufacturing a reticle includes: performing a first operation for forming a pattern on the reticle in a first processing tool; moving the reticle to a reticle pod; performing an inspection operation on the reticle by transmitting a radiation through a transparent window of the reticle pod; and determining whether a cleaning or repairing operation is to be performed in response to a result of the inspection operation.

According to an embodiment, a method of manufacturing a reticle includes: performing a first operation for forming a pattern on the reticle in a first processing tool; moving the reticle to a reticle pod, the reticle pod comprising a window allowing the pattern to be visible through the window; performing an inspection operation on the reticle through the window; and performing a repairing operation or a cleaning operation in response to determining that a defect is found during the inspection operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a reticle, comprising:
disposing the reticle in a reticle pod, the reticle pod forming a sealed space to accommodate the reticle, and the reticle pod comprising a window arranged on an upper surface of the reticle pod and configured to allow a radiation at a predetermined wavelength to pass through; and
performing an inspection operation on the reticle through the window.

2. The method of claim 1, further comprising performing a first operation for forming a pattern on the reticle prior to the disposing of the reticle.

3. The method of claim 2, further comprising performing a second operation for repairing the pattern on the reticle in response to a defect being found during the inspection operation.

4. The method of claim 2, further comprising performing a lithography operation by transferring the pattern on the reticle to a workpiece in response to no defect being found.

5. The method of claim 2, wherein the first operation includes a development operation for forming a patterned photoresist layer of the reticle, further comprising:
transporting the reticle from the reticle pod to a semiconductor tool subsequent to the inspection operation; and
causing a foreign particle to be removed from the reticle in response to the foreign particle being detected during the inspection operation.

6. The method of claim 5, further comprising performing a patterning operation using the patterned photoresist layer as an etch mask subsequent to the removal of the foreign particle.

7. The method of claim 5, further comprising cleaning a processing tool performing the development operation prior to a patterning operation in response to the foreign particle being detected.

8. The method of claim 2, wherein the first operation includes a development operation for forming a patterned mask layer of the reticle, further comprising:
transporting the reticle from the reticle pod to a semiconductor tool subsequent to the inspection operation; and
repairing a defective portion of the patterned mask layer in response to the defective portion being detected during the inspection operation.

9. The method of claim 8, further comprising performing a patterning operation using the patterned mask layer as an etch mask subsequent to the repairing of the defective portion.

10. The method of claim 1, wherein the performing of the inspection operation comprises emitting an inspection radiation to pass through the window and receiving reflected radiation from the reticle.

11. A method of manufacturing a reticle, comprising:
performing a first operation for forming a pattern on the reticle in a first processing tool;
moving the reticle to a reticle pod;
performing an inspection operation on the reticle by transmitting a radiation through a transparent window of the reticle pod; and
determining whether a cleaning or repairing operation is to be performed in response to a result of the inspection operation.

12. The method of claim 11, wherein the radiation has a wavelength so as not to react with a photoresist material of the reticle.

13. The method of claim 12, wherein the wavelength is in a range between about 400 nm and about 700 nm.

14. The method of claim 11, wherein the transparent window comprises a window body and a transparent film on two sides of the window body.

15. The method of claim 14, wherein the transparent film comprises at least one of aluminum zinc oxide (AZO), indium tungsten oxide (ITO), fluorine doped tin oxide (FTO) and carbon nanotube.

16. The method of claim 14, wherein the transparent film comprises a thickness between about 20 nm and about 200 nm.

17. The method of claim 14, wherein the reticle pod comprising a cover including an opaque material laterally surrounding the transparent window.

18. A method of manufacturing a reticle, comprising:
performing a first operation for forming a pattern on the reticle in a first processing tool;
moving the reticle to a reticle pod, the reticle pod comprising a window allowing the pattern to be visible through the window;
performing an inspection operation on the reticle through the window; and
performing a repairing operation or a cleaning operation in response to determining that a defect is found during the inspection operation.

19. The method of claim 18, wherein the reticle is kept within the reticle pod during the inspection operation.

20. The method of claim 18, wherein window comprises a window body and a film on two sides of the window body, wherein the film has a transmittance of greater than about 65% of an inspection radiation used in the inspection operation.

\* \* \* \* \*